US009361934B2

(12) United States Patent
Yuki

(10) Patent No.: US 9,361,934 B2
(45) Date of Patent: Jun. 7, 2016

(54) VEHICLE-MOUNTED ELECTRONIC DEVICE
(71) Applicant: Panasonic Corporation, Osaka (JP)
(72) Inventor: Keizo Yuki, Kanagawa (JP)
(73) Assignee: PANASONIC INTELLECTUAL PROPERTY MANAGEMENT CO., LTD., Osaka (JP)
( * ) Notice: Subject to any disclaimer, the term of this patent is extended or adjusted under 35 U.S.C. 154(b) by 0 days.
(21) Appl. No.: 14/388,352
(22) PCT Filed: Mar. 27, 2013
(86) PCT No.: PCT/JP2013/002104
§ 371 (c)(1),
(2) Date: Sep. 26, 2014
(87) PCT Pub. No.: WO2013/145744
PCT Pub. Date: Oct. 3, 2013
(65) Prior Publication Data
US 2015/0054646 A1 Feb. 26, 2015
(30) Foreign Application Priority Data Mar. 28, 2012 (JP) ................................. 2012-073211
Mar. 28, 2012 (JP) ................................. 2012-073212

(51) Int. Cl.
*H04R 3/12* (2006.01)
*G11B 20/00* (2006.01)
(Continued)
(52) U.S. Cl.
CPC ........ *G11B 20/00731* (2013.01); *B60Q 3/0223* (2013.01); *G11B 20/00739* (2013.01);
(Continued)
(58) Field of Classification Search
CPC ................... B60K 2350/90; B60K 2350/901; B60K 2350/35; B60K 2350/352; G11B 20/00731; G11B 20/00739
See application file for complete search history.

(56) References Cited
U.S. PATENT DOCUMENTS 7,015,799 B1* 3/2006 Kitano ...................... B60R 7/04
180/89.11
7,190,798 B2* 3/2007 Yasuhara ............... H04B 1/205
381/123
(Continued)

FOREIGN PATENT DOCUMENTS

JP 2004-246819 A 9/2004
JP 2009-026401 A 2/2009
(Continued)

OTHER PUBLICATIONS

International Search Report for Application No. PCT/JP2013/002104 dated May 7, 2013.

*Primary Examiner* — Van Trieu
(74) *Attorney, Agent, or Firm* — Pearne & Gordon LLP

(57) ABSTRACT

The present invention has an object to improve usability of a vehicle-mounted electronic device. The vehicle-mounted electronic device is configured to execute, when unauthorized content is detected by an unauthorized content detecting unit, an audio reproduction restriction on a display device, and when a volume change operation is executed during the audio reproduction restriction, to cause the display device to display a message indicating that the volume change operation has been executed during the audio reproduction restriction. More specifically, the displayed message indicates that the audio reproduction restriction associated with the unauthorized content reproduction is executed and the volume change operation is also executed during the execution. Therefore, the volume can be changed when next content is reproduced, resulting in preventing unexpected high-volume audio from being outputted and thus improving usability.

16 Claims, 12 Drawing Sheets

(51) Int. Cl.
  *G11B 20/10* (2006.01)
  *B60Q 3/02* (2006.01)
  *H03G 3/34* (2006.01)

(52) U.S. Cl.
  CPC .... *G11B20/00818* (2013.01); *G11B 20/10527* (2013.01); *H03G 3/342* (2013.01); *H04R 3/12* (2013.01); *B60K 2350/35* (2013.01); *B60K 2350/352* (2013.01); *G11B 2020/10574* (2013.01); *G11B 2220/2537* (2013.01)

(56) References Cited

U.S. PATENT DOCUMENTS

| | | | | |
|---|---|---|---|---|
| 2002/0031236 | A1* | 3/2002 | Shimizu | H04R 3/00 381/104 |
| 2003/0053638 | A1* | 3/2003 | Yasuhara | H04B 1/205 381/86 |
| 2004/0230532 | A1 | 11/2004 | Hirai et al. | |
| 2008/0084361 | A1* | 4/2008 | Ueta | B60K 35/00 345/7 |
| 2009/0055650 | A1 | 2/2009 | Nakano | |
| 2009/0086099 | A1 | 4/2009 | Higaki | |
| 2010/0223477 | A1 | 9/2010 | Onoda et al. | |
| 2012/0104844 | A1* | 5/2012 | Koiso | G08G 1/094 307/9.1 |

FOREIGN PATENT DOCUMENTS

| | | |
|---|---|---|
| JP | 2009-054144 A | 3/2009 |
| JP | 2009-088646 A | 4/2009 |
| WO | 2009/050884 A1 | 4/2009 |

* cited by examiner

VEHICLE-MOUNTED ELECTRONIC DEVICE

TECHNICAL FIELD

The present invention relates to a vehicle-mounted electronic device, and more particularly to a vehicle-mounted electronic device including a display device and a reproducing device, and a vehicle-mounted electronic device including a front seat electronic device and a rear seat electronic device.

BACKGROUND ART

Such a vehicle-mounted electronic device is installed, for example, in a one box vehicle and is configured such that a rear seat display device displays various content to be viewed from the rear seat.

In recent years, such a vehicle-mounted electronic device has also been required to perform unauthorized content reproduction restriction. As a countermeasure to this, it has been examined to adopt a content protection technology by which, for example, audio output is stopped when unauthorized content reproduction is detected (for example, see the following Patent Literature 1).

CITATION LIST

Patent Literature

Patent Literature 1: WO2009/050884

SUMMARY OF INVENTION

Technical Problem

When the above described content protection technology is applied to the vehicle-mounted electronic device, the unauthorized content reproduction restriction (such as setting a mute state as the volume reproduction restriction) can be surely performed, but the following problems will occur.

Specifically, for example, those who sit on the rear seat of the one box vehicle viewing various content on the rear seat display device (rear seat display equipment) are often children. In this case, the children cannot understand why the content has suddenly gone into a mute state during reproduction.

For this reason, for example, the children often use the remote controller to execute a volume change operation (increasing the volume) during the audio reproduction restriction.

Alternatively, the children simply tell the driver while driving that the content has gone into a mute state and ask the driver to take a measure to this.

However, even if the measure to the mute state is asked by the children, the driver cannot confirm the state in the rear seat while driving. Therefore, eventually, for example, the driver often uses the remote controller to execute a volume change operation (increasing the volume).

In such a circumstance, even if the children or the driver executes the volume change operation (increasing the volume), the audio output is not performed while the volume reproduction restriction (for example, the mute state) is in place, and as a result, they determine that the optical disc storing the content is defective and often reproduce the next optical disc.

However, at this time, the volume change operation (increasing the volume) has already been executed, which causes an unexpected high-volume of audio to be outputted, thus surprising the children and the driver, resulting in poor usability.

In addition, when the children ask the driver for a measure to the mute state while driving, the driver may stop the vehicle and get into the rear seat to confirm the situation and take a measure to the unauthorized content (exchanging the content).

As described above, the vehicle-mounted electronic device using a conventional content protection technology is poor in usability not only for the driver but also for the passengers.

In light of this, it is an object of the present invention to improve usability of the vehicle-mounted electronic device.

Solution to Problem

In order to achieve the above object, a vehicle-mounted electronic device according to a first aspect of the present invention includes: a display device; a control device connected to the display device; a reproducing device connected to the control device; and an unauthorized content detecting unit provided in at least one of the control device and the reproducing device, wherein the control device is configured to execute, when unauthorized content is detected by the unauthorized content detecting unit, an audio reproduction restriction on the display device, and when a volume change operation is executed during the audio reproduction restriction, to cause the display device to display a message indicating that the volume change operation has been executed during the audio reproduction restriction. This configuration is intended to achieve the intended object.

In addition, the vehicle-mounted electronic device according to a second aspect of the present invention includes: a front seat electronic device and a rear seat electronic device; a control device connected to the front seat electronic device and the rear seat electronic device; a reproducing device connected to the control device; and an unauthorized content detecting unit provided in at least one of the control device and the reproducing device, wherein the control device is configured to execute, when unauthorized content is detected by the unauthorized content detecting unit, a reproduction restriction on the a rear seat electronic device, and to cause the front seat electronic device to display a message indicating the execution state of the reproduction restriction in the rear seat electronic device. This configuration is intended to achieve the intended object.

Advantageous Effects of Invention

As described above, the vehicle-mounted electronic device according to the first aspect of the present invention includes: a display device; a control device connected to the display device; a reproducing device connected to the control device; and an unauthorized content detecting unit provided in at least one of the control device and the reproducing device, wherein the control device is configured to execute, when unauthorized content is detected by an unauthorized content detecting unit, an audio reproduction restriction on the display device, and when a volume change operation is executed during the audio reproduction restriction, to cause the display device to display a message indicating that the volume change operation has been executed during the audio reproduction restriction, thus improving usability.

Specifically, in the present invention, when unauthorized content is detected by the unauthorized content detecting unit, an audio reproduction restriction is executed on the display device, and when a volume change operation is executed during the audio reproduction restriction, the display device display a message indicating that the volume change operation has been executed during the audio reproduction restriction. Thus, the displayed message indicates that the audio reproduction restriction associated with the unauthorized content reproduction is executed and the volume change operation is also executed during the execution.

Therefore, the volume can be changed when next content is reproduced, resulting in preventing unexpected high-volume audio from being outputted and thus improving usability.

In addition, as described above, the vehicle-mounted electronic device according to the second aspect of the present invention includes: a front seat electronic device and a rear seat electronic device; a control device connected to the front seat electronic device and the rear seat electronic device; a reproducing device connected to the control device; and an unauthorized content detecting unit provided in at least one of the control device and the reproducing device, wherein the control device is configured to execute, when unauthorized content is detected by the unauthorized content detecting unit, a reproduction restriction on the rear seat electronic device, and to cause the front seat electronic device to display a message indicating the execution state of the reproduction restriction in the rear seat electronic device, thus improving usability.

Specifically, in the present invention, when unauthorized content is detected by the unauthorized content detecting unit, a reproduction restriction is executed on the rear seat electronic device, and a message indicating the execution state of the reproduction restriction in the rear seat electronic device is displayed by the front seat electronic device. Thus, the reproduction restriction state can be confirmed even from the driver seat by viewing the front seat electronic device.

Therefore, the present invention can prompt those sitting on the rear seat to take an appropriate measure (such as exchanging content) without interrupting driving, thus improving usability.

DESCRIPTION OF EMBODIMENTS

Hereinafter, embodiments of the present invention will be described with reference to the accompanying drawings.

First Embodiment

Figure 1:
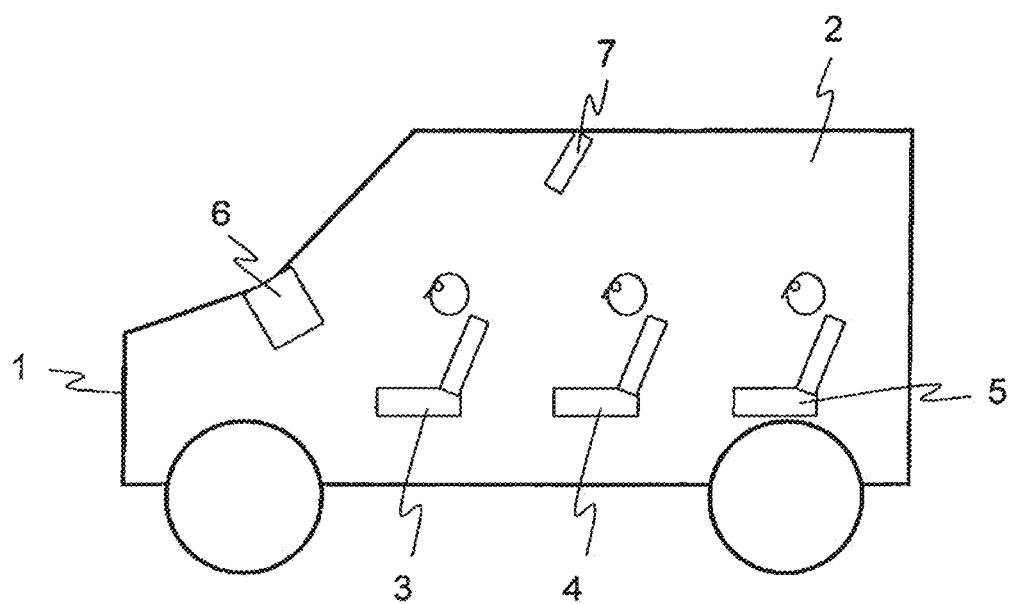
FIG. 1 is a view illustrating a vehicle including a vehicle-mounted electronic device according to an embodiment of the present invention.

FIG. 1 is a view illustrating a vehicle including a vehicle-mounted electronic device according to an embodiment of the present invention.

In this figure, reference numeral 1 denotes a vehicle, wherein a driver seat 3 and a passenger seat (unillustrated) are provided forward of a vehicle interior 2, and rear seats 4 and 5 are provided rearward of the vehicle interior 2.

In addition, a front seat electronic device 6 is provided forward of the driver seat 3 in the vehicle interior 2, and further a rear seat electronic device 7 is provided on a ceiling portion between the driver seat 3 and the rear seat 4 in the vehicle interior 2.

Specifically, the front seat electronic device 6 is viewed or heard mainly from the driver seat 3 and the passenger seat (unillustrated), and the rear seat electronic device 7 is viewed or heard mainly from the rear seats 4 and 5.

Figure 2:
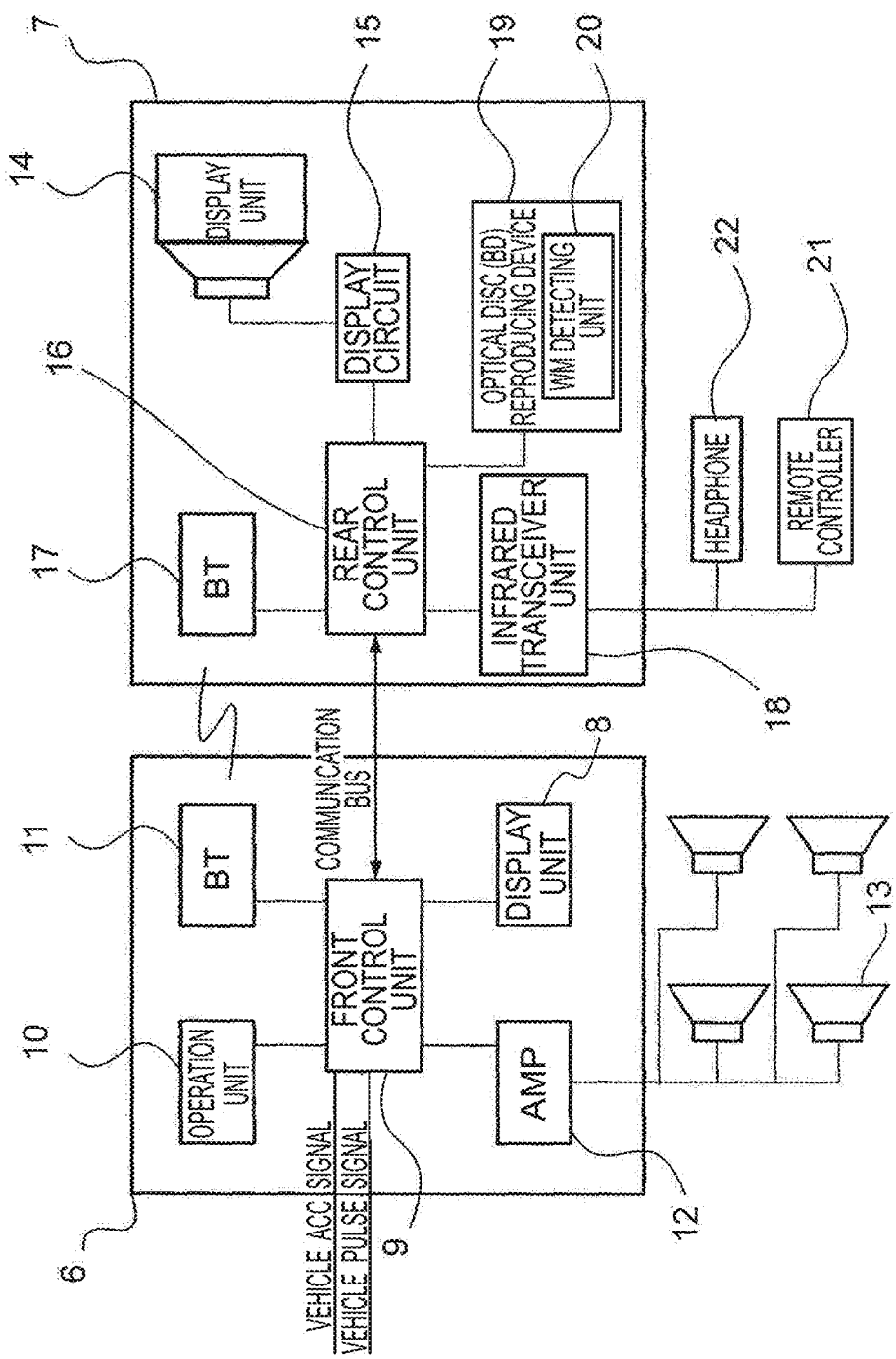
FIG. 2 is a control block diagram of the vehicle-mounted electronic device.

FIG. 2 is a control block diagram of the above described vehicle-mounted electronic device (the front seat electronic device 6 and the rear seat electronic device 7).

As illustrated in FIG. 2, the front seat electronic device 6 includes a display unit 8; a front control unit 9 connected to the display unit 8; an operation unit 10 connected to the front control unit 9; a Bluetooth (registered trademark) communication unit (BT) 11; and an amplifier (AMP) 12.

In addition, four speakers 13 are connected to the amplifier 12. Of them, two speakers 13 are provided forward of the driver seat 3 in the vehicle interior 2, and remaining two speakers 13 are provided rearward of the vehicle interior 2.

Meanwhile, as illustrated in FIG. 2, the rear seat electronic device 7 includes a display unit 14; a rear control unit 16 connected to the display unit 14 through a display circuit 15; a Bluetooth (registered trademark) communication unit (BT) 17 connected to the rear control unit 16; an infrared transceiver unit 18; and a reproducing device 19.

Note that the audio reproduced by the reproducing device 19 is electrically transmitted between the communication units 11 and 17, thus allowing the audio to be outputted from the speakers 13.

Further, an unauthorized content detecting unit (Watermark (WM) detecting unit) 20 is provided in the reproducing device 19, and thus the unauthorized content detecting unit 20 is in a state of being connected to the reproducing device 19 and the rear control unit 16.

Note that the infrared transceiver unit 18 is provided to operate the reproducing device 19 with the remote controller 21 and to transmit audio from the reproducing device 19 to the headphone 22.

In addition, a vehicle speed pulse signal (vehicle pulse signal) is supplied from the vehicle 1 to the front control unit 9, and the vehicle pulse signal is used to determine whether the vehicle is running or stopped.

Further, a switch signal (vehicle ACC signal) is supplied from the vehicle 1 to the front control unit 9, and the vehicle ACC signal is used to activate the front seat electronic device 6 and the rear seat electronic device 7.

Furthermore, the front control unit 9 of the front seat electronic device 6 is in a state of being connected to the rear control unit 16 of the rear seat electronic device 7 through a communication bus of the vehicle interior 2.

Assuming the above configuration, the following description will focus on an example of viewing or hearing an optical disc (unillustrated) from the rear seats 4 and 5 using the reproducing device 19.

Figure 3:
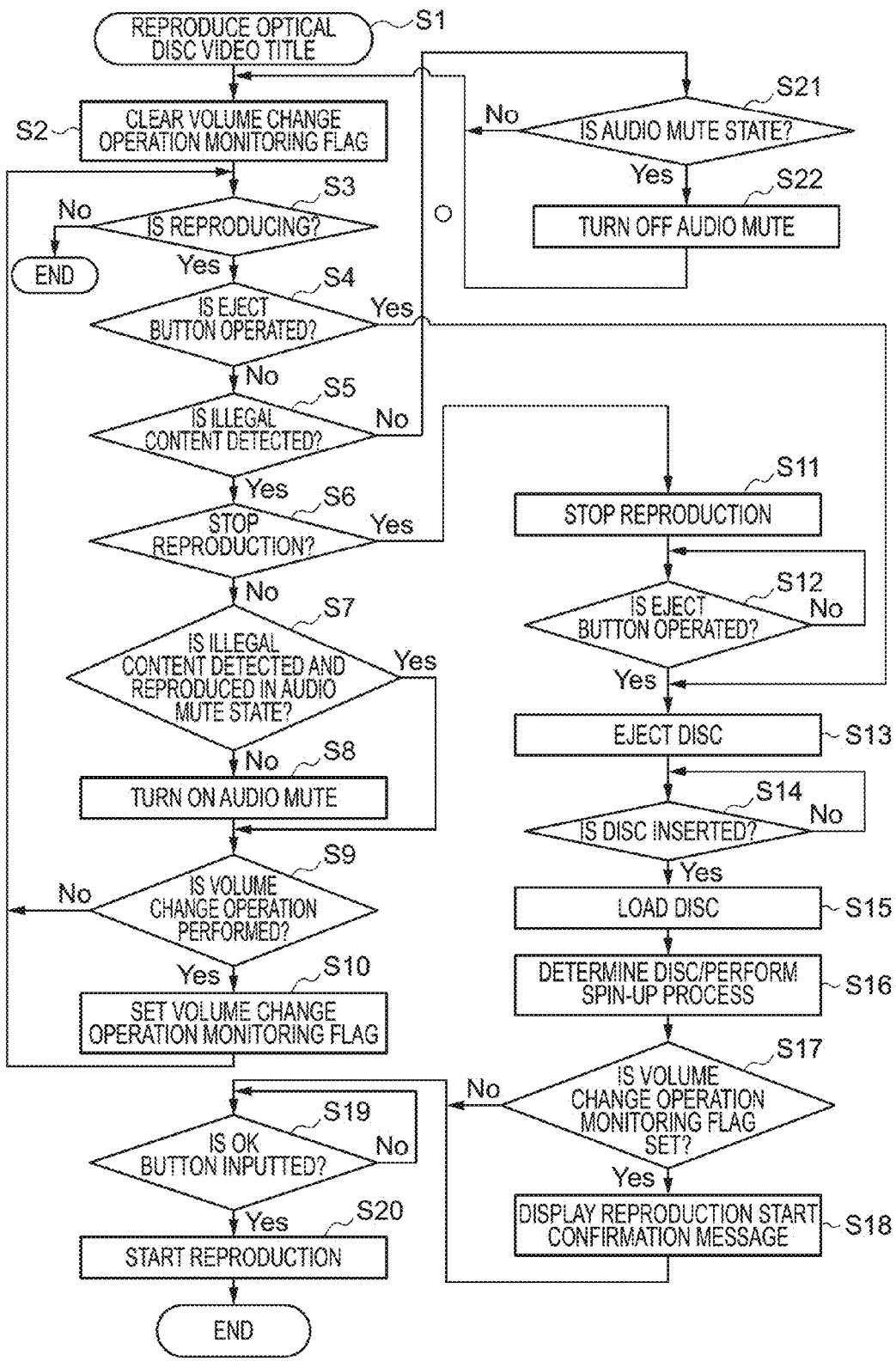
FIG. 3 is an operation flow chart of the vehicle-mounted electronic device according to a first aspect.

FIG. 3 is an operation flow chart of the vehicle-mounted electronic device according to a first aspect of the present invention. An optical disc (Blue-ray Disc (BD)) is mounted on the reproducing device 19 to be in a reproducing state (S1). Then, the rear control unit 16 initially clears a volume change operation monitoring flag (S2).

Then, the rear control unit 16 determines whether or not the optical disc is in the reproducing state (S3). If the optical disc is not in the reproducing state (S3: No), the process ends. Meanwhile, if the optical disc is in the reproducing state (S3: Yes), the rear control unit 16 determines whether or not an optical disc eject button (unillustrated) is operated (S4). If the eject button is not operated (S4: No), the rear control unit 16 determines whether or not unauthorized content is detected (S5).

Then, if the unauthorized content is detected (S5: Yes), the rear control unit 16 determines whether or not to stop the reproduction (S6).

Note that in step S6, it is not yet aware of reproduction of the unauthorized content. In other words, "No" is determined in step S6. Thus, reproduction stop operation is not performed. As a result, the rear control unit 16 determines whether or not unauthorized content is detected and whether or not content is reproduced in an audio stop state (mute state) (S7).

Then, if the audio stop state (mute state) is not determined (S7: No), the rear control unit 16 stops audio output from the speaker 13 through the front control unit 9 (S8). Meanwhile, if a determination is made that unauthorized content is detected and the audio stop state (mute state) is determined (S7: Yes), the process moves to step S9 without going to step S8.

Then, the rear control unit 16 determines whether or not the volume change operation is performed in the audio stop state (mute state) (S9). Here, if a determination is made that the volume change operation is performed, resulting in "Yes," the volume change operation monitoring flag is set (S10). In other words, the reproduction in the audio stop state is continuously executed. The process after step S10 returns to step S3 to continue the following process. Meanwhile, if a determination is made that the volume change operation is not performed, resulting in "No," the process returns to step S3 to continue the following process.

When the volume change operation monitoring flag is set in step S10, the user may be tired of the reproduction in the mute state and is expected to execute the reproduction stop operation. Then, in step S6, a determination is made that the reproduction is stopped (S6: Yes), and the process moves to step S11 to stop the reproduction. Then, if the optical disc eject operation is performed (S12: Yes), the optical disc is ejected (S13).

Then, if a new optical disc is inserted (S14: Yes), as is known, the optical disc is driven (S15). Then, the optical disc type is determined and the spin-up process is performed (S16).

Then, the rear control unit 16 determines whether the volume change operation monitoring flag is set or not (S17).

If a determination is made in step S17 that the volume change operation monitoring flag is set (S17: Yes), the rear control unit 16 and the front control unit 9 display a reproduction start confirmation message on the display units 8 and 14 (S18).

Figure 4:
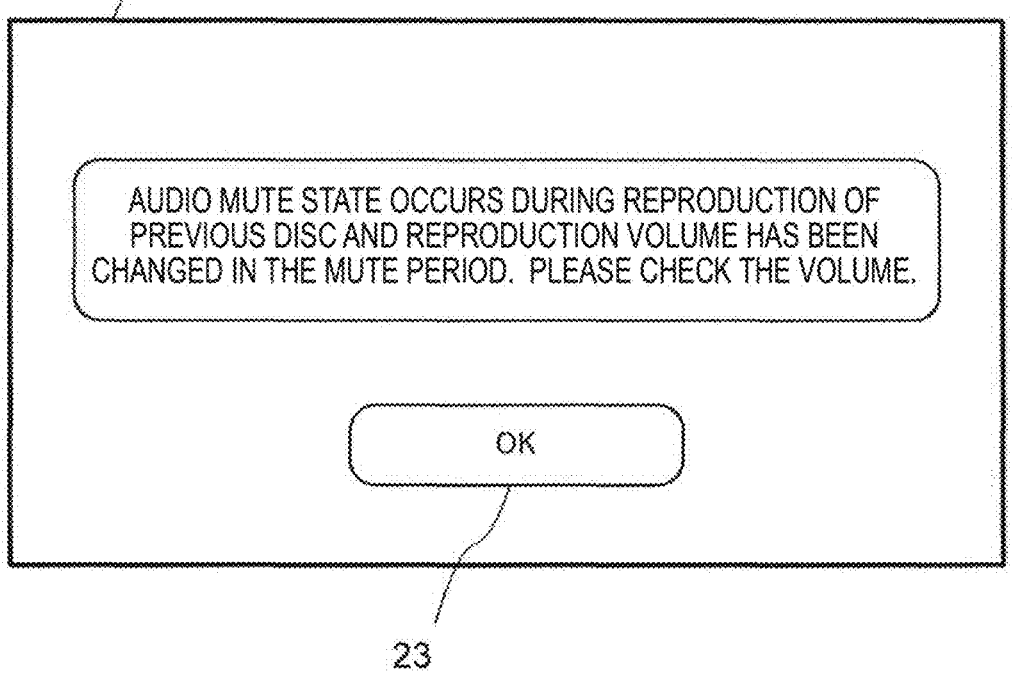
FIG. 4 is a view illustrating the operation (display of a reproduction start confirmation message).

FIG. 4 is an example of a display of the reproduction start confirmation message. In this example, the message indicates that "AUDIO MUTE STATE OCCURS DURING REPRODUCTION OF PREVIOUS DISC AND REPRODUCTION VOLUME HAS BEEN CHANGED IN THE MUTE PERIOD. PLEASE CHECK THE VOLUME." In other words, the user is notified that an audio reproduction restriction associated with the unauthorized content reproduction is executed and a volume change operation is also executed during the execution, and the user is prompted to check the volume.

Note that in the example illustrated herein, the rear control unit 16 and the front control unit 9 cause the display units 8 and 14 to display not only the above message but also a confirmation operation portion 23 used for confirming that the volume change operation is executed.

Therefore, if the confirmation operation portion 23 in one of the display units 8 and 14 is operated (S19: Yes), the reproduction is started (S20), and series of processes end. Note that after the processes end, the process returns to step S1 to repeat the above described processes.

If a determination is made in step S17 that the volume change operation monitoring flag is not set (S17: No), the process moves to step S19 without going to step S18. Then, the optical disc reproduction is started (S20), and series of processes end. Then, the process returns to step S1 to repeat the above described processes.

Note that if a determination is made in step S5 that there is no unauthorized content in this optical disc (S5: No), the process moves to step S21 to detect an audio reproduction restriction state. If the audio mute state is determined (S21: Yes), the audio reproduction restriction is cancelled (S22), and the process returns to step S2.

As described above, in the present embodiment, when unauthorized content is detected by the unauthorized content detecting unit 20, the audio reproduction restriction is executed on the display units 8 and 14, and when the volume is changed during the audio reproduction restriction, the display units 8 and 14 display a message indicating that the volume change operation is executed during the audio reproduction restriction.

In such a configuration, the message indicates that the audio reproduction restriction associated with the unauthorized content reproduction is executed and the volume change operation is also executed during the execution.

Therefore, the volume can be changed when next content is reproduced, resulting in preventing unexpected high-volume audio from being outputted and thus improving usability.

Second Embodiment

The present embodiment uses the same vehicle including a vehicle-mounted electronic device and the same control block of the vehicle-mounted electronic device as those illustrated in FIGS. 1 and 2 respectively, and thus the repetitive description will be omitted.

The following description will focus on an example of viewing or hearing an optical disc (unillustrated) from the rear seats 4 and 5 using the reproducing device 19.

Figure 5:
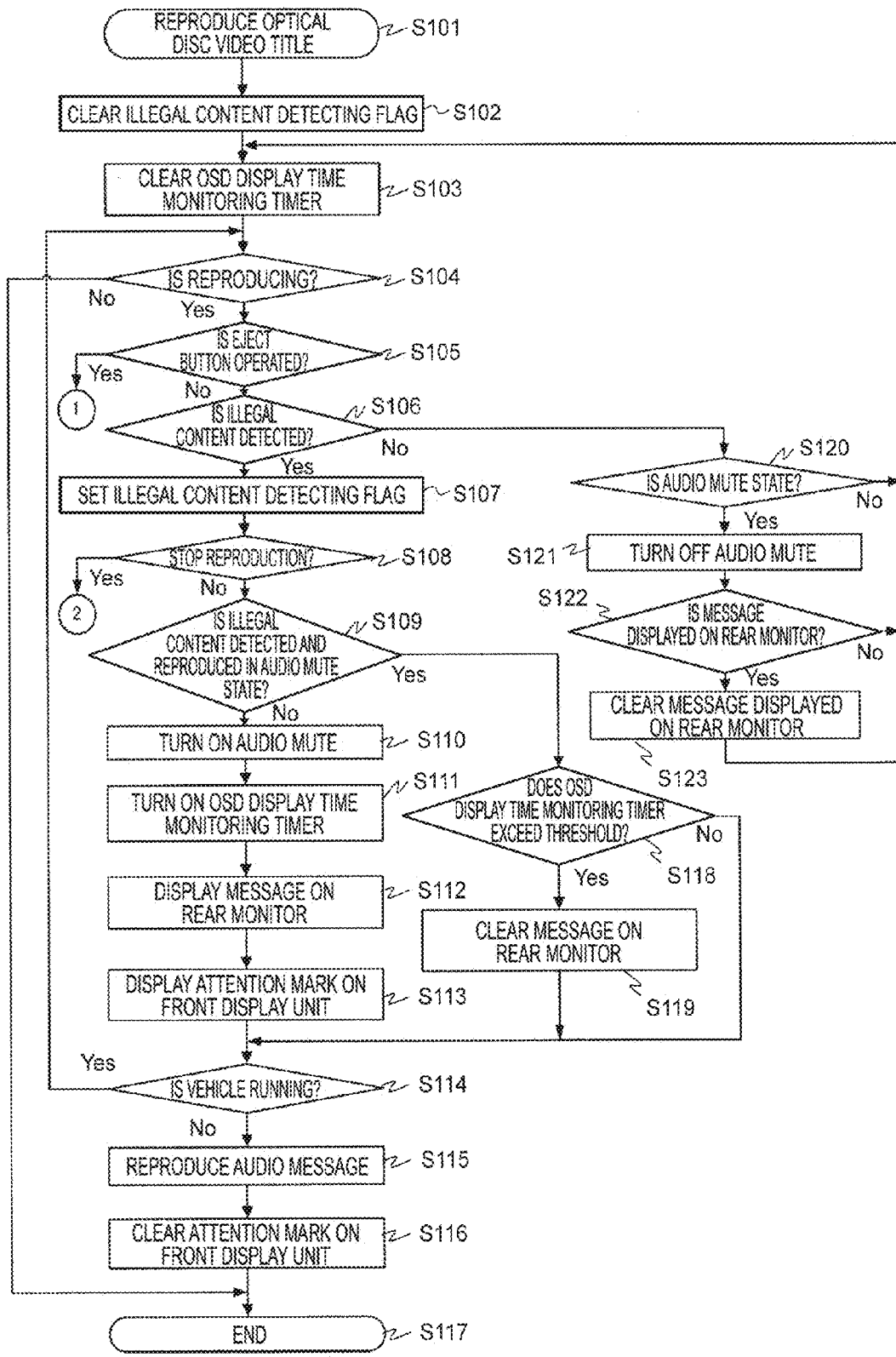
FIG. 5 is an operation flow chart of the vehicle-mounted electronic device according to a second aspect.

FIG. 5 is an operation flow chart of the vehicle-mounted electronic device according to a second aspect of the present invention.

An optical disc is mounted on the reproducing device 19 so that the video title is in a reproducing state (S101). Then, the rear control unit 16 initially clears an unauthorized content detecting flag (S102), and then clears an OSD display time monitoring timer (S103).

Then, the rear control unit 16 determines whether the optical disc is in a reproducing state or not (S104). If the optical disc is in the reproducing state (S104: Yes), the rear control unit 16 determines whether the optical disc eject button (unillustrated) is operated or not (S105). If the eject button (unillustrated) is not operated (S105: No), the rear control unit 16 determines whether unauthorized content is detected or not (S106).

Then, if the unauthorized content is detected (S106: Yes), the unauthorized content detecting flag is set (S107). Then, the rear control unit 16 determines whether or not to stop the reproduction (S108).

Examples of stopping the reproduction in step S108 (S108: Yes) include reproducing an optical disc that records video and audio without the authorization in a movie theater. Such video and audio data also contain "data called WM indicating that the video and audio are taped without the authorization in a movie theater." Therefore, the unauthorized content detecting unit 20 detects this data and stops reproduction.

Figure 6:
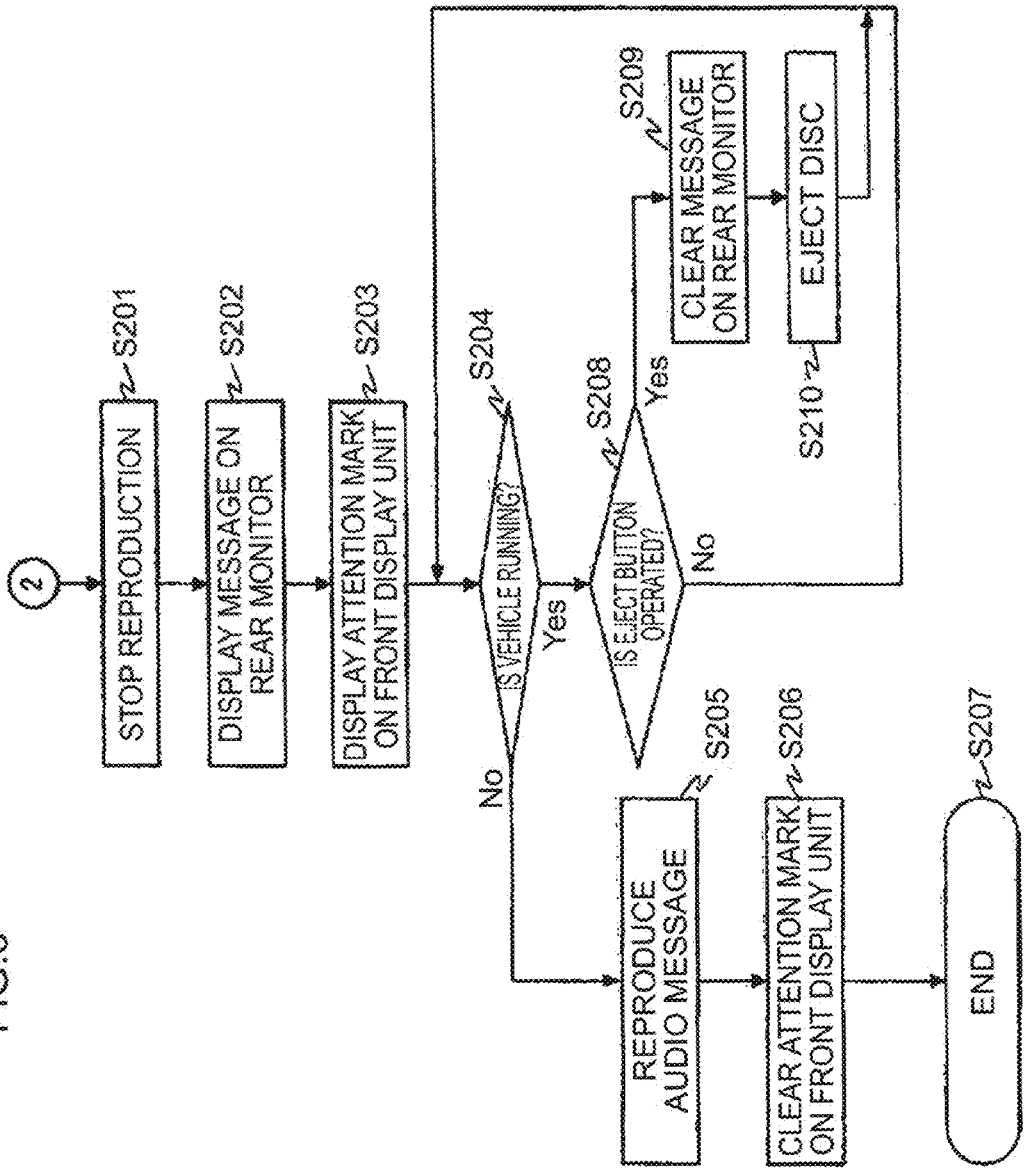
FIG. 6 is a flow chart of a process after reproduction stop.

FIG. 6 is a flow chart for describing a process after the reproduction is stopped.

In FIG. 6, when the reproduction is stopped (S201), subsequently, the rear control unit 16 causes the display unit (monitor) 14 of the rear seat electronic device 7 to display a message indicating that unauthorized content is detected and the reproduction is stopped (S202).

Figure 7:
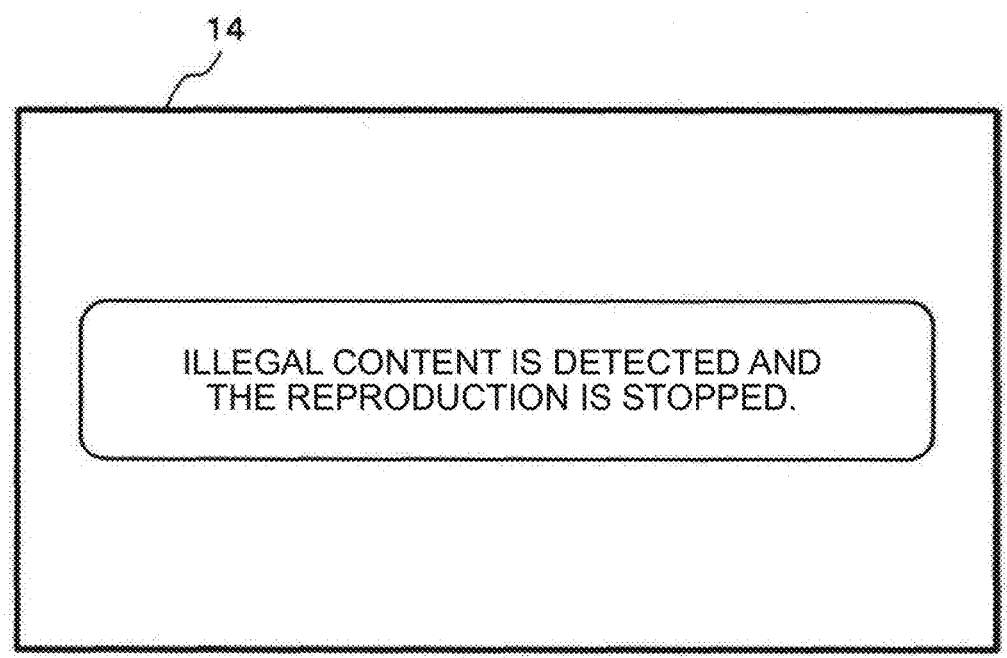
FIG. 7 is an example of a message displayed in step S202.

FIG. 7 is an example of a message displayed in step S202. In this example, the message indicates that "unauthorized content is detected and the reproduction is stopped."

Then, the rear control unit 16 causes the display unit 8 of the front seat electronic device 6 through the front control unit 9 to display an attention mark indicating that unauthorized content is detected and the reproduction is stopped on the display unit 14 of the rear seat electronic device 7 (S203).

Figure 8:
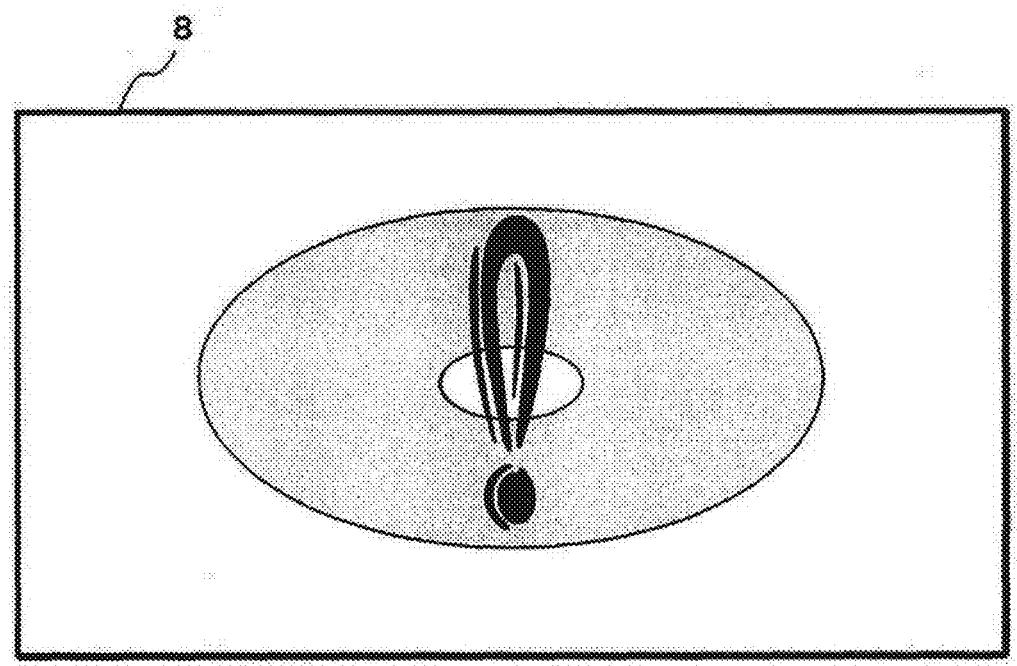
FIG. 8 is an example of an attention mark displayed in step S203.

FIG. 8 is an example of the attention mark displayed in step S203.

Then, the rear control unit 16 determines whether the vehicle 1 is currently running or not (S204).

At this time, based on a vehicle speed pulse supplied from the vehicle 1, the front control unit 9 determines whether the vehicle 1 is currently running or not, and then based on this determination, the rear control unit 16 determines whether the vehicle 1 is currently running or not.

Then, if a determination is made that the vehicle 1 is in a stopped state (S204: No), the rear control unit 16 causes the front control unit 9 to inform the driver and the like through the speaker 13 by audio that "unauthorized content is detected and the reproduction is stopped" (S205).

Figure 9:
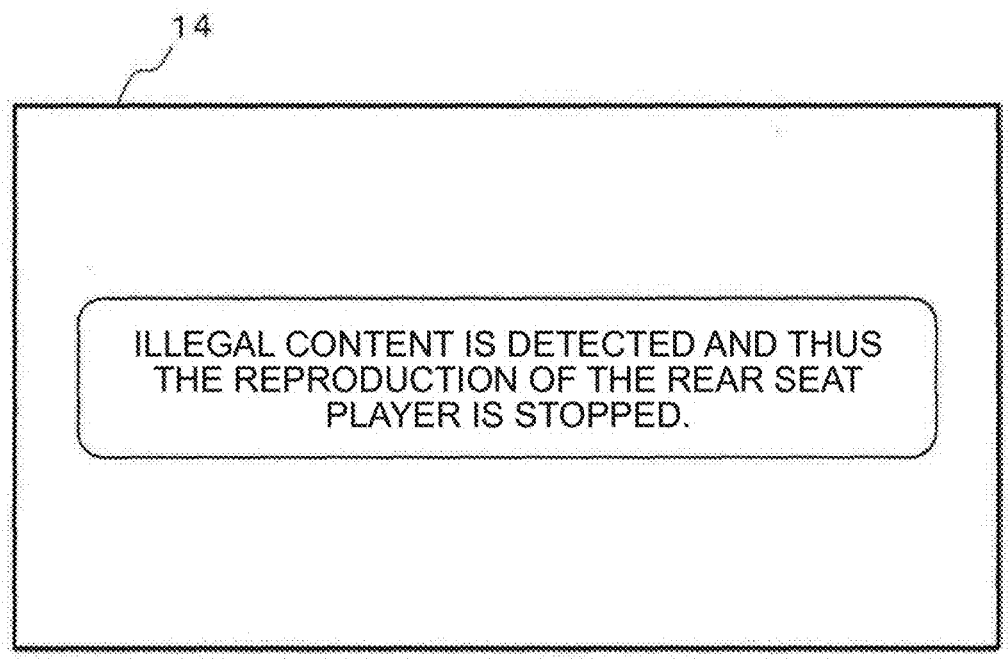
FIG. 9 is an example of a message displayed in step S205.

FIG. 9 is an example of a message displayed in step S205. In this example, the message indicates that "unauthorized content is detected and thus the reproduction of the rear seat player is stopped." In other words, the driver is also informed that "unauthorized content is detected and the reproduction is stopped," which allows all the users to be surely informed of this situation so as to take a subsequent measure (for example, ejecting the optical disc).

After such an audio output, the attention mark displayed on the display unit 14 of the rear seat electronic device 7 as illustrated in FIG. 8 is cleared (S206), and the process ends (S207).

Meanwhile, if a determination is made in step S204 that the vehicle 1 is running (S204: Yes), the rear control unit 16 determines whether the eject button (unillustrated) of the optical disc is operated or not (S208).

Then, if a determination is made in step S208 that the eject button (unillustrated) of the optical disc is operated (S208: Yes), the message (FIG. 7) displayed on the display unit 14 in step S202 is cleared (S209).

Thus, subsequently, the optical disc is ejected (S210).

Now, referring back to FIG. 5, if the unauthorized content detecting unit 20 determines in step S108 that unauthorized content (in which a WM different from that of the theater version movie copy is recorded) other than the theater version movie copy is detected, the reproduction is not stopped (S108: No). Then, the rear control unit 16 determines whether or not the content is reproduced in the audio stop state (mute state) (S109).

Then, if a determination is made that the content is reproduced not in the audio stop state (mute state) (S109: No), the rear control unit 16 causes the front control unit 9 to stop audio output from the speaker 13 (S110).

Then, the rear control unit 16 turns on the monitoring timer (S111), and then causes the display unit 14 of the rear seat electronic device 7 to display a message indicating that the audio mute is turned on (S112).

Figure 10:
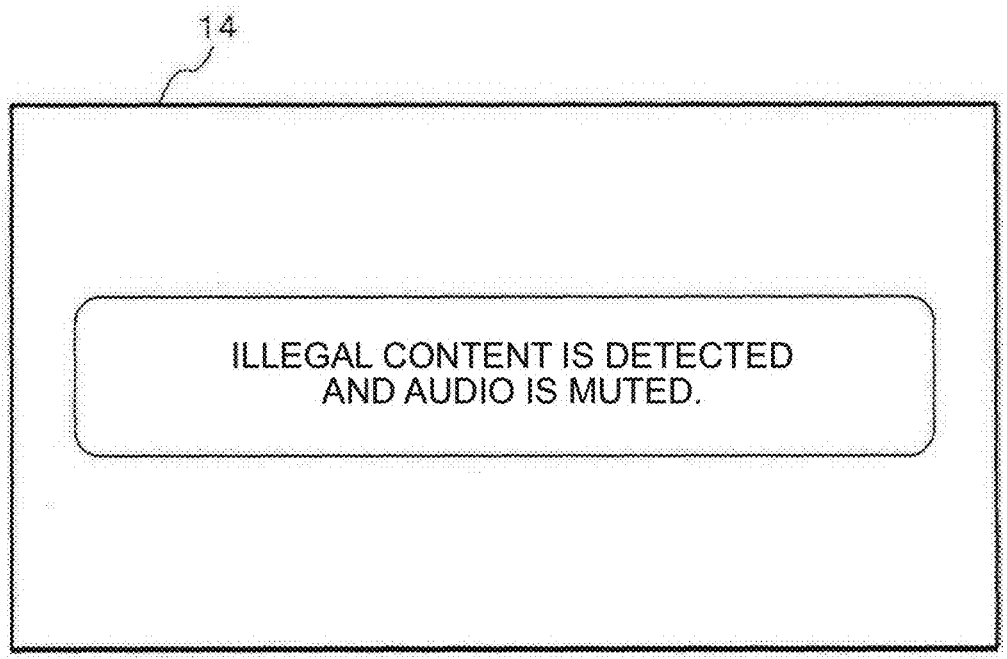
FIG. 10 is an example of a message displayed in step S112.

FIG. 10 is an example of a message displayed in step S112. In this example, the message indicates that "unauthorized content is detected and audio is muted."

Note that the message illustrated in FIG. 10 is displayed, for example, for 15 seconds set in step S111. When 15 seconds have elapsed, the message illustrated in FIG. 10 is cleared and the optical disc content is reproduced in the mute state.

Then, when the message illustrated in FIG. 10 is displayed in step S112, the rear control unit 16 causes the display unit 8 of the front seat electronic device 6 through the front control unit 9 to display an attention mark (S113).

Then, the rear control unit 16 determines whether the vehicle 1 is currently running or not (S114).

At this time, based on a vehicle speed pulse supplied from the vehicle 1, the front control unit 9 determines whether the vehicle 1 is currently running or not, and then based on this determination, the rear control unit 16 determines whether the vehicle 1 is currently running or not.

Then, if a determination is made that the vehicle 1 is in a stopped state (S114: No), the rear control unit 16 causes the speaker 13 to inform the driver and the like through the front control unit 9 by audio that "unauthorized content is detected and audio is stopped" (S115).

Figure 11:
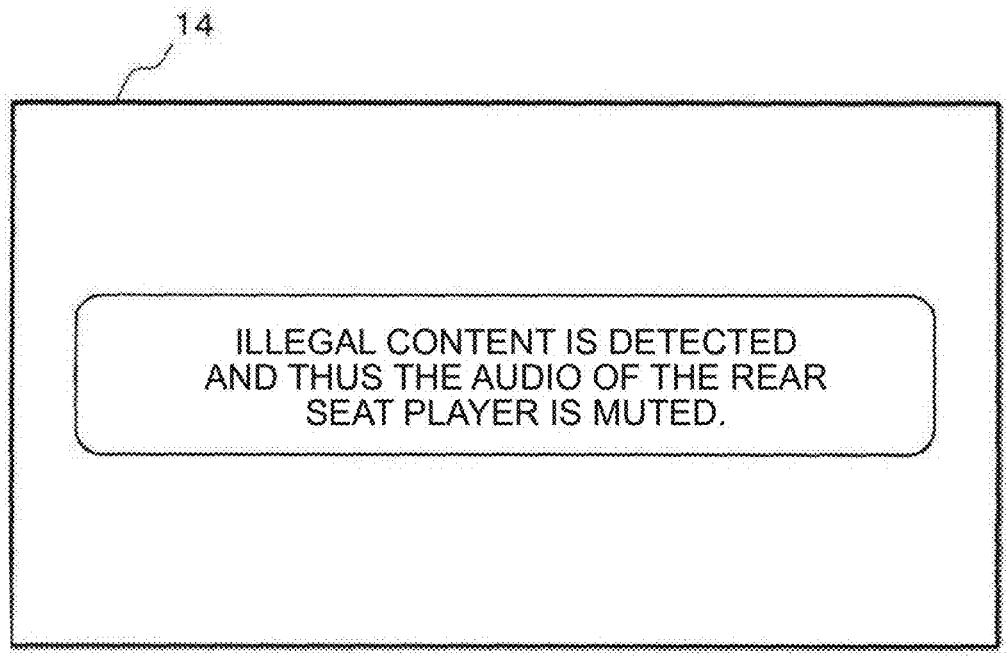
FIG. 11 is an example of an attention mark displayed in step S115.

FIG. 11 is an example of an attention mark displayed in step S115. In this example, the message indicates that "unauthorized content is detected and thus the audio of the rear seat player is muted."

In other words, the driver is also informed that "unauthorized content is detected and the audio reproduction is stopped," which allows all the users to be surely informed of this situation so as to take a subsequent measure (for example, ejecting the optical disc).

After such an audio output, the attention mark displayed on the display unit 14 of the rear seat electronic device 7 as illustrated in FIG. 8 is cleared (S116), and the process ends (S117).

Meanwhile, if the unauthorized content detecting unit 20 determines in step S109 that unauthorized content (in which a WM different from that of the theater version movie copy is recorded) other than the theater version movie copy is detected and audio is stopped (mute state) (S109: Yes), the process moves to step S118. When the monitoring timer exceeds 15 seconds (S118: Yes), the message displayed on the display unit 14 of the rear seat electronic device 7 as illustrated in FIG. 10 is cleared (S119).

More specifically, the message displayed on the display unit 14 of the rear seat electronic device 7 in step S112 as illustrated in FIG. 10 is cleared.

Meanwhile, if the unauthorized content is not detected in S106 (S106: No), for example, if a part other than an unauthorized content portion in the optical disc is reproduced, the rear control unit 16 determines whether the content is reproduced in the audio stop state (mute state) or not (S120).

Then, if a determination is made that the content is reproduced in the audio stop state (mute state) (S102: Yes), the rear control unit 16 removes the audio stop state (mute state) (S121).

More specifically, at this time, the content does not fall into the unauthorized content portion in the optical disc. Thus, the rear control unit 16 removes the audio stop state (mute state) and causes the front control unit 9 to allow audio to be outputted from the speaker 13.

Then, the rear control unit 16 determines whether or not the display unit 14 of the rear seat electronic device 7 displays a message as illustrated in FIG. 10 (S122). If the message is displayed (S122: Yes), the rear control unit 16 clears the message (S123), and allows normal video and audio to be reproduced.

Meanwhile, the following description will focus on a state (S105: Yes) in which an optical disc eject button (unillustrated) is operated in step S105.

Figure 12:
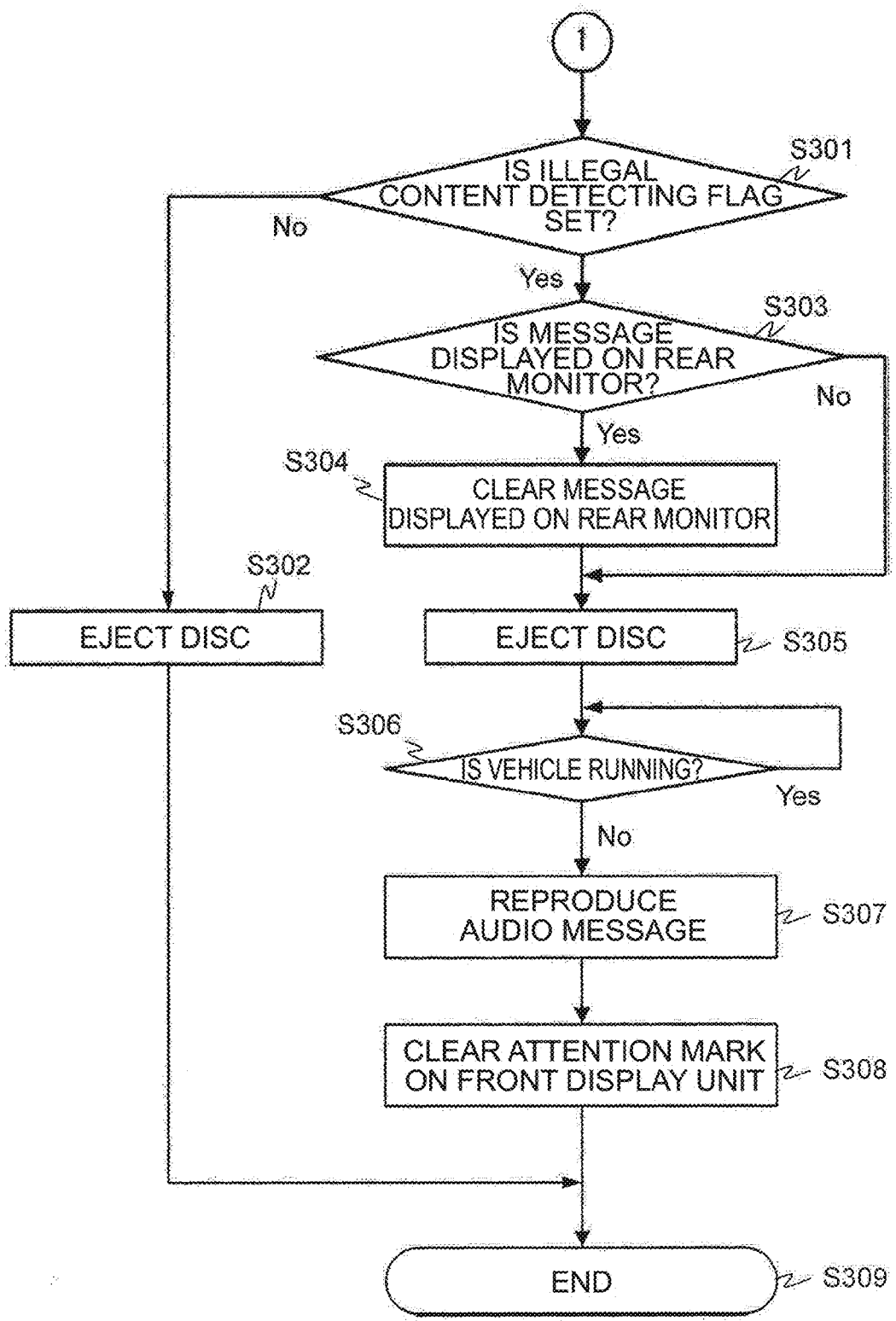
FIG. 12 is a flow chart of a process after Yes is determined in step S105.

FIG. 12 is a flow chart for describing a process after "Yes" is determined in step S105.

At this time, the rear control unit 16 determines whether unauthorized content even once is detected or not (S301). If unauthorized content is not detected (S301: No), the optical disc is ejected (S302).

Meanwhile, if unauthorized content is detected (S301: Yes), the rear control unit 16 determines whether or not the message illustrated in FIG. 10 is displayed on the display unit 14 of the rear seat electronic device 7 (S303). If the message is displayed (S303: Yes), the message is cleared (S304) and the optical disc is ejected (S305).

Then, the rear control unit 16 determines whether the vehicle 1 is currently running or not (S306).

At this time, based on a vehicle speed pulse supplied from the vehicle 1, the front control unit 9 determines whether the vehicle 1 is currently running or not, and then based on this determination, the rear control unit 16 determines whether the vehicle 1 is currently running or not.

Then, if a determination is made that the vehicle 1 is in a stopped state (S306: No), the rear control unit 16 causes the speaker 13 to inform the driver and the like through the front control unit 9 by audio that "unauthorized content is detected and audio is stopped" as illustrated in FIG. 11 (S307).

In other words, the driver is also informed that "unauthorized content is detected and the audio reproduction is stopped," which allows all the users to be surely informed of this situation so as to take a subsequent measure (for example, subsequently no use of the optical disc).

After such an audio output, the attention mark displayed on the display unit 14 of the rear seat electronic device 7 as illustrated in FIG. 8 is cleared (S308), and the process ends (S309).

As described above, in the present embodiment, when unauthorized content is detected by the unauthorized content detecting unit 20, a reproduction restriction is executed on the rear seat electronic device 7 and a message indicating the execution state of the reproduction restriction in the rear seat electronic device 7 is displayed by the front seat electronic device 6. Thus, the reproduction restriction state can be confirmed even from the driver seat by viewing the display unit 8 of the front seat electronic device 6.

Therefore, the present invention can prompt those sitting on the rear seat to take an appropriate measure (such as exchanging content) without interrupting driving, thus improving usability.

INDUSTRIAL APPLICABILITY

As described above, the vehicle-mounted electronic device according to the first aspect of the present invention is configured to execute, when unauthorized content is detected by the unauthorized content detecting unit, an audio reproduction restriction on the display device, and when a volume change operation is executed during the audio reproduction restriction, to cause the display device to display a message indicating that the volume change operation has been executed during the audio reproduction restriction. Thus, the displayed message indicates that the audio reproduction restriction associated with the unauthorized content reproduction is executed and the volume change operation is also executed during the execution.

Therefore, the volume can be changed when next content is reproduced, resulting in preventing unexpected high-volume audio from being outputted and thus improving usability.

Thus, the present invention is expected to be applied to various vehicle-mounted electronic devices.

In addition, the vehicle-mounted electronic device according to the second aspect of the present invention includes: a front seat electronic device and a rear seat electronic device; a control device connected to the front seat electronic device and the rear seat electronic device; a reproducing device connected to the control device; and an unauthorized content detecting unit provided in at least one of the control device and the reproducing device, wherein the control device is configured to execute, when unauthorized content is detected by the unauthorized content detecting unit, a reproduction restriction on the rear seat electronic device, and to cause the front seat electronic device to display a message indicating the execution state of the reproduction restriction in the rear seat electronic device, thus improving usability.

Specifically, in the present invention, when unauthorized content is detected by the unauthorized content detecting unit, a reproduction restriction is executed on the rear seat electronic device, and a message indicating the execution state of the reproduction restriction in the rear seat electronic device is displayed by the front seat electronic device. Thus, the reproduction restriction state can be confirmed even from the driver seat by viewing the front seat electronic device.

Therefore, the present invention can prompt those sitting on the rear seat to take an appropriate measure (such as exchanging content) without interrupting driving, thus improving usability.

Thus, the present invention is expected to be applied to various vehicle-mounted electronic devices.

REFERENCE SIGNS LIST 1 vehicle
2 vehicle interior
3 driver seat
4 rear seat
5 rear seat
6 front seat electronic device
7 rear seat electronic device
8 display unit
9 front control unit
10 operation unit
11 communication unit
12 amplifier
13 speaker
14 display unit
15 display circuit
16 rear control unit
17 communication unit
18 infrared transceiver unit
19 reproducing device
20 unauthorized content detecting unit 21 remote controller
22 headphone
23 confirmation operation portion

The invention claimed is:

1. A vehicle-mounted electronic device comprising:
a display device;
a control device connected to the display device;
a reproducing device connected to the control device; and
an unauthorized content detecting unit provided in at least one of the control device and the reproducing device, wherein
the control device is configured to execute, when unauthorized content is detected by the unauthorized content detecting unit, an audio reproduction restriction on the display device, and when a volume change operation is executed during the audio reproduction restriction, to cause the display device to display a message indicating that the volume change operation has been executed during the audio reproduction restriction.

2. The vehicle-mounted electronic device according to claim 1, wherein
the display device includes a front seat display device and a rear seat display device; and the control device is connected to the front seat display device and the rear seat display device, and wherein
the control device is configured to execute, when unauthorized content is detected by the unauthorized content detecting unit, an audio reproduction restriction on the front seat display device and the rear seat display device, and when a volume change operation is executed during the audio reproduction restriction, to cause at least the front seat display device of the front seat display device and the rear seat display device to display a message indicating that the volume change operation is executed.

3. The vehicle-mounted electronic device according to claim 2, wherein the control device comprises a front control unit for controlling the front seat display device and a rear control unit for controlling the rear seat display device, the front control unit being connected with the rear control unit, and the rear control unit being connected to the unauthorized content detecting unit and the reproducing device.

4. The vehicle-mounted electronic device according to claim 1, wherein the control device is configured to cause the display device to display a message indicating that the volume change operation is executed, and a confirmation operation portion for confirming that the volume change operation is executed.

5. The vehicle-mounted electronic device according to claim 4, wherein
the display device includes a front seat display device and a rear seat display device; and the control device is connected to the front seat display device and the rear seat display device, and wherein
the control device is configured to execute, when unauthorized content is detected by the unauthorized content detecting unit, an audio reproduction restriction on the front seat display device and the rear seat display device, and when a volume change operation is executed during the audio reproduction restriction, to cause at least the front seat display device of the front seat display device and the rear seat display device to display a message indicating that the volume change operation is executed.

6. The vehicle-mounted electronic device according to claim 5, wherein the control device comprises a front control unit for controlling the front seat display device and a rear control unit for controlling the rear seat display device, the front control unit being connected with the rear control unit, and the rear control unit being connected to the unauthorized content detecting unit and the reproducing device.

7. The vehicle-mounted electronic device according to claim 4, wherein the control device is configured to start the reproduction operation after the confirmation operation portion is operated.

8. The vehicle-mounted electronic device according to claim 7, wherein
the display device includes a front seat display device and a rear seat display device; and the control device is connected to the front seat display device and the rear seat display device, and wherein
the control device is configured to execute, when unauthorized content is detected by the unauthorized content detecting unit, an audio reproduction restriction on the front seat display device and the rear seat display device, and when a volume change operation is executed during the audio reproduction restriction, to cause at least the front seat display device of the front seat display device and the rear seat display device to display a message indicating that the volume change operation is executed.

9. The vehicle-mounted electronic device according to claim 8, wherein the control device comprises a front control unit for controlling the front seat display device and a rear control unit for controlling the rear seat display device, the front control unit being connected with the rear control unit, and the rear control unit being connected to the unauthorized content detecting unit and the reproducing device.

10. The vehicle-mounted electronic device according to claim 1, wherein the unauthorized content detecting unit detects unauthorized content attempted to be reproduced by the reproducing device.

11. The vehicle-mounted electronic device according to claim 1, wherein the unauthorized content detecting unit is a Watermark (WM) detecting unit.

12. A vehicle-mounted electronic device comprising:
a front seat electronic device and a rear seat electronic device;
a control device connected to the front seat electronic device and the rear seat electronic device;
a reproducing device connected to the control device; and
an unauthorized content detecting unit provided in at least one of the control device and the reproducing device, wherein
the control device is configured to execute, when unauthorized content is detected by the unauthorized content detecting unit, a reproduction restriction on the rear seat electronic device, and to cause the front seat electronic device to display a message indicating the execution state of the reproduction restriction in the rear seat electronic device.

13. The vehicle-mounted electronic device according to claim 12, wherein while the vehicle is not running, the control device is configured to cause, when unauthorized content is detected by the unauthorized content detecting unit, the front seat electronic device to display a message indicating the execution state of the reproduction restriction in the rear seat electronic device, and to provide a message indicating the execution state of the reproduction restriction by audio.

14. The vehicle-mounted electronic device according to claim 12, wherein the control device includes a front control unit for controlling the front seat electronic device and a rear control unit for controlling the rear seat electronic device, the front control unit being connected with the rear control unit, and the rear control unit being connected to the unauthorized content detecting unit and the reproducing device.

15. The vehicle-mounted electronic device according to claim 14, wherein while the vehicle is not running, the control device is configured to cause, when unauthorized content is detected by the unauthorized content detecting unit, the front seat electronic device to display a message indicating the execution state of the reproduction restriction in the rear seat electronic device, and to provide a message indicating the execution state of the reproduction restriction by audio.

16. The vehicle-mounted electronic device according to claim 12, wherein the control device determines whether the vehicle is running or stopped after unauthorized content is detected by the unauthorized content detecting unit, and if the vehicle is running or stopped, the control device is configured to execute a reproduction restriction on the rear seat electronic device, and the front seat electronic device to display an attention mark indicating the execution state of the reproduction restriction in the rear seat electronic device.

\* \* \* \* \*